(12) United States Patent
Mao et al.

(10) Patent No.: US 7,057,203 B2
(45) Date of Patent: *Jun. 6, 2006

(54) LOW WORK FUNCTION MATERIAL

(75) Inventors: Dongsheng Mao, Austin, TX (US); Zvi Yaniv, Austin, TX (US); Richard Lee Fink, Austin, TX (US); Igor Pavlovsky, Austin, TX (US)

(73) Assignee: Nano-Proprietary, Inc., Austin, TX (US)

( * ) Notice: Subject to any disclaimer, the term of this patent is extended or adjusted under 35 U.S.C. 154(b) by 71 days.

This patent is subject to a terminal disclaimer.

(21) Appl. No.: 10/715,934

(22) Filed: Nov. 18, 2003

(65) Prior Publication Data

US 2004/0102044 A1 May 27, 2004

Related U.S. Application Data

(63) Continuation-in-part of application No. 10/005,989, filed on Dec. 5, 2001, now Pat. No. 6,885,022.

(60) Provisional application No. 60/254,374, filed on Dec. 8, 2000.

(51) Int. Cl.
*H01L 29/06* (2006.01)

(52) U.S. Cl. .................... 257/10; 438/678; 257/24

(58) Field of Classification Search ............... 438/689
See application file for complete search history.

(56) References Cited

U.S. PATENT DOCUMENTS

| 5,548,185 A | 8/1996 | Kumar et al. ............ 313/495 |
|---|---|---|
| 6,057,637 A | 5/2000 | Zettl et al. ............... 313/310 |
| 6,239,547 B1 | 5/2001 | Uemura et al. ........... 313/495 |
| 6,250,984 B1 * | 6/2001 | Jin et al. .................... 445/51 |
| 6,283,812 B1 * | 9/2001 | Jin et al. .................... 445/24 |
| 6,436,221 B1 | 8/2002 | Chang et al. ............. 156/247 |
| 6,441,550 B1 | 8/2002 | Patterson et al. ......... 313/495 |
| 6,495,258 B1 * | 12/2002 | Chen et al. ............... 428/408 |
| 6,616,495 B1 | 9/2003 | Tsuboi ....................... 445/24 |
| 6,705,910 B1 | 3/2004 | Sheu et al. ................. 445/24 |
| 2002/0104603 A1 | 8/2002 | Chang et al. ............ 156/89.12 |

FOREIGN PATENT DOCUMENTS

EP 0989579 3/2000

OTHER PUBLICATIONS

*Handbook of Chemistry and Physics*, 59$^{th}$ Edition, 1978-1979, pp. 81-82.

(Continued)

*Primary Examiner*—Thao P. Le
(74) *Attorney, Agent, or Firm*—Edward Mickelson; Kelly K. Kordzik; Winstead Sechrest & Minick P.C.

(57) ABSTRACT

The present invention is directed toward methods for incorporating low work function metals and salts of such metals into carbon nanotubes for use as field emitting materials. The present invention is also directed toward field emission devices, and associated components, comprising treated carbon nanotubes that have, incorporated into them, low work function metals and/or metal salts, and methods for making same. The treatments of the carbon nanotubes with the low work function metals and/or metal salts serve to improve their field emission properties relative to untreated carbon nanotubes when employed as a cathode material in field emission devices.

8 Claims, 9 Drawing Sheets

OTHER PUBLICATIONS

M.F. Islam, "High Weight Fraction Surfactant Solubilization of Single-Wall Carbon Nanotubes in Water," *Nano Letters*, 2003, vol. 3, No. 2, pp. 269-273.

"The Silver/Silver Chloride Reference Electrode," available via the Internet at http://www.tannerm.com/ag_ref.htm, 1998, Tanner McCarron, pp. 1-8.

Won Seok Kim et al., "Secondary Electron Emission from Magnesium Oxide on Multiwalled Carbon Nanotubes," *Applied Physics Letters*, vol. 81, No. 6, Aug. 5, 2002, pp. 1098-1100.

J.N. Heo et al., "Effect of MgO Film Thickness on Secondary Electron Emission from MgO-coated Carbon Nanotubes," *Physica B*, 323 (2002), pp. 174-176.

Young-Woo Son et al., "Electron Structure and the Field Emission Mechanism of MgO-coated Carbon Nanotubes," *New Journal of Physics*, 5 (2003), pp. 152.1-152.9.

SeGi Yu et al., "Field Emission Energy Distribution of MgO-coated MWCNTs," *Physica B*, 323 (2002), pp. 177-179.

* cited by examiner

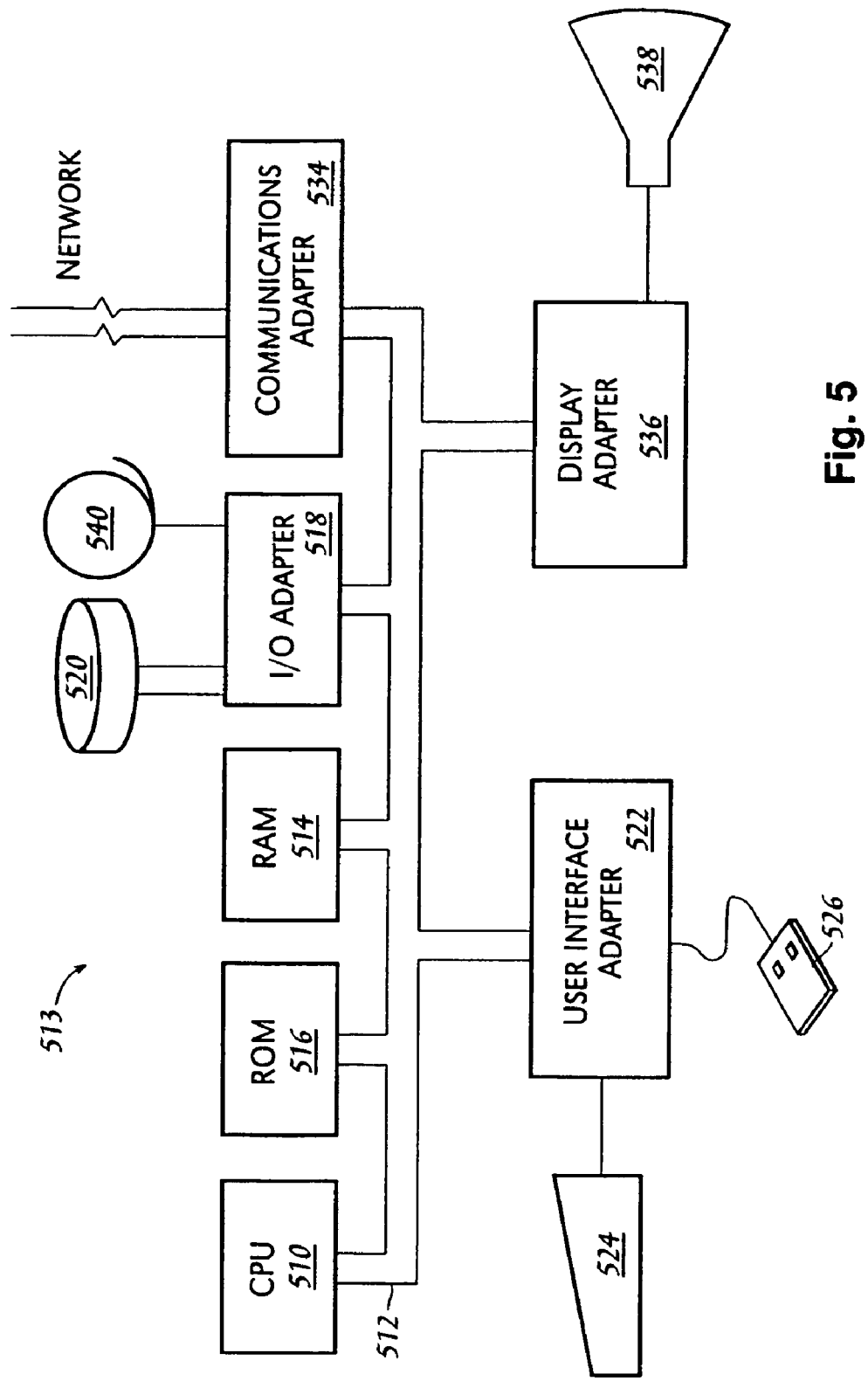

LOW WORK FUNCTION MATERIAL

CROSS-REFERENCE TO RELATED APPLICATIONS

The present application is a continuation-in-part of U.S. patent application Ser. No. 10/005,989 filed Dec. 5, 2001 now U.S. Pat. No. 6,885,022, which claims priority to U.S. Provisional Patent Application Ser. No. 60/254,374 filed Dec. 8, 2000.

TECHNICAL FIELD

The present invention relates in general to field emission devices, and in particular to field emission devices comprising carbon nanotubes.

BACKGROUND INFORMATION

Carbon films, including carbon nanotube (CNT) materials, are being developed for cold cathode applications. These applications include field emission displays, x-ray tubes, microwave devices, CRTs, satellite thrusters, or any applications requiring a source of electrons. There are many types of carbon films that are being considered. The emission mechanism believed to be responsible for the emission of electrons from these carbon films is the Fowler-Nordheim theory; this is especially true for the carbon films that are conducting. Included in this emission mechanism is an electrical barrier at the surface of the conductor that prevents electrons from exiting the metal. However, if a strong field is applied, this barrier is lowered or made thin such that electrons can now "tunnel" through the barrier to create a finite emission current. The height of this barrier is partially determined by the work function at the particular surface of the material. The work function is dependent on the material, which surface of the material an attempt to extract electrons is being made, whether or not there are impurities on this surface and how the surface is terminated. What is important is that the lower the work function, the lower the barrier becomes and the easier it is to extract electrons from the carbon film. If a means or treatment is developed that lowers the value of the work function, then it becomes easier to extract electrons from the film; easier in the sense that lower extraction fields are required and higher currents can be obtained from treated films as opposed to untreated films operated at the same extraction field.

In analyzing field emission data, there are four unknowns in the Fowler-Nordheim (F-N) equation. These are n, $\alpha$, $\beta$, and $\Phi$ with n the number of emission sites (e.g., tips), $\alpha$ the emission area per site, $\beta$ the field enhancement factor and $\Phi$ the work function. The F-N equation is given by:

$$I = \alpha A \exp B$$

with $$A = 1.54 \; 10^{-6} \, E^2/\Phi$$

$$B = -6.87 \; 10^7 \, \Phi^{1.5} \, v/E$$

$$v = 0.95 - y^2$$

and $$y = 3.79 \; 10^{-4} \, E^{0.5}/\Phi$$

The field at an emission site is $E = \beta E_0$ with $E_0 = V/d$ where V is the extraction voltage and d the cathode-to-anode distance.

To see the effect that work function has on the field emission current, the graph in FIG. 1 shows how lowering the work function from 4.6 eV to 2.4 eV significantly lowers the threshold electric field and allows much higher current densities (orders of magnitude) at a given electrical field.

Single wall carbon nanotubes (SWNTs) and multiwall carbon nanotubes (MWNTs) can be used as carbon materials for field emission applications because they are tall and thin and have sharp features. These sharp features enhance the electric field at these points (large $\beta$), thus a larger field can be achieved with a given applied voltage. Being made of carbon, they are also conductive, mechanically very strong, and chemically robust. The work function of the SWNT material (4.8 eV) is slightly higher than graphite (4.6–4.7 eV), as disclosed in Suzuki et al., APL, Vol. 76, p. 4007, Jun. 26, 2000, which is hereby incorporated by reference herein.

What is needed is a means of optimizing the field emission properties of a carbon material by lowering the work function of this material. This would improve the emission characteristics of the carbon nanotube material, both SWNT and MWNT.

SUMMARY OF THE INVENTION

The present invention is directed toward methods for incorporating low work function metals and salts of such metals into carbon nanotubes for use as field emitting materials. The present invention is also directed toward field emission devices, and associated components, comprising treated carbon nanotubes that have, incorporated into them, low work function metals and/or metal salts, and methods for making same. The treatments of the carbon nanotubes with the low work function metals and/or metal salts serve to improve their field emission properties relative to untreated carbon nanotubes when employed as a cathode material in field emission devices.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 illustrates a data processing system;

DETAILED DESCRIPTION

The work function of a surface can be lowered by depositing metal materials (e.g., alkali metals) or metal salts (e.g., cesium salts) on the surface, or in some cases such as carbon, by intercalating or doping the metal atoms or ions into the structure of the carbon material.

The present invention is directed toward methods for lowering the work function of carbon nanotube surfaces by the addition and/or incorporation of metal materials and/or metal salts. Such addition and/or incorporation may comprise deposition, coating, adsorption, doping, intercalation, and combinations thereof.

Carbon nanotubes (CNTs), according to the present invention, include, but are not limited to, single-wall carbon nanotubes (SWNTs), double-wall carbon nanotubes, multi-wall carbon nanotubes (MWNTs), carbon fibrils, bucky-tubes, metallic carbon nanotubes, semi-conducting carbon nanotubes, semi-metallic carbon nanotubes, chiral carbon nanotubes, chemically-modified carbon nanotubes, capped carbon nanotubes, open-ended carbon nanotubes, endohedrally-modified carbon nanotubes, and combinations thereof CNTs, according to the present invention, can be made by any known method. Such methods, some of which require metal catalysts, include, but are not limited to, arc-synthesis, chemical vapor deposition, chemical vapor deposition with either a supported or an unsupported catalyst, laser-oven synthesis, flame synthesis, and combinations thereof.

A metal material, according to the present invention, can be comprised of any metallic element or combination of elements of the periodic table which has a work function generally less than about 4 eV, typically less than about 3.5 eV, and more typically less than about 3 eV. Examples of suitable metals include, but are not limited to, alkali metals, alkaline earth metals, transitional metals, rare-earth metals, p-block metals, metal alloys, and combinations thereof A metal salt, according to the present invention, can be any salt of any of the metal materials described herein. Examples of such salts include, but are not limited to, metal halides, metal nitrates, metal carbonates, metal nitrides, metal oxides, and combinations thereof.

As an example of how metals can affect the work function of a surface, Cs (cesium) atoms lower the work function when they are attached to carbon material, but it has been found that the resistance of a SWNT is a non-monotonous function of the Cs uptake. Resistance decreases initially with Cs uptake, goes through a minimum, then increases with further doping and finally saturates.

Furthermore, Cs can also be used to make a negative electron affinity surface of GaAs. In this case, a monolayer of Cs bonded with oxygen on the surface of GaAs leads to an optimum bending of the conduction and valence band at the surface, making a negative electron surface. Increasing the Cs concentration on the surface leads to a metallic surface with increased work function and highly unstable, very chemically reactive.

Figure 1:
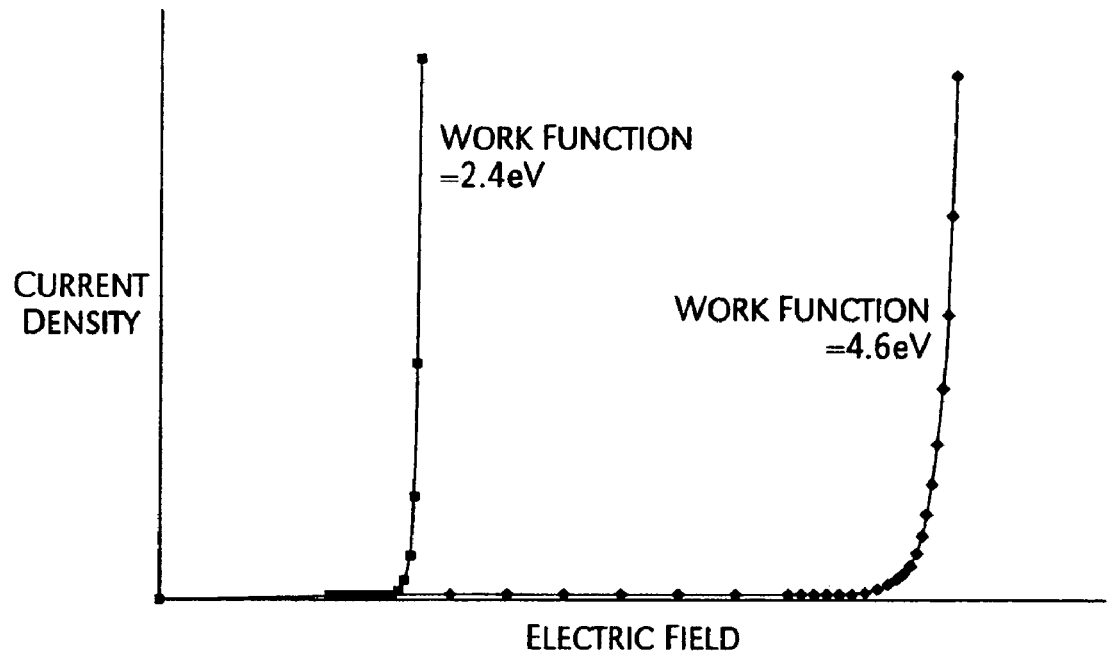
FIG. 1 illustrates a graph of current density versus electric field.
Figure 2:
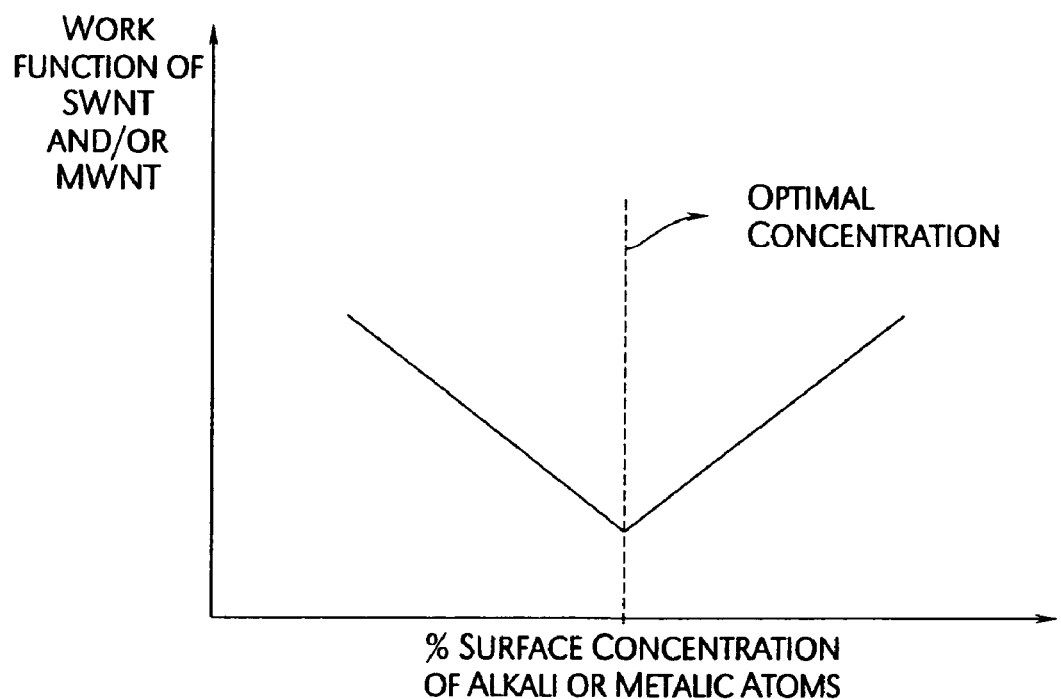
FIG. 2 illustrates a graph of work function versus surface concentration of alkali or metallic atoms.

When this same principle is applied to SWNTs and MWNTs, the work function of the CNT materials is decreased, and this process may be optimized to obtain an optimal situation in the decrease of the work function material (see FIG. 2).

In some embodiments of the present invention, a CNT layer is grown in situ on a substrate, then metal materials or metal salts are deposited on this layer. In some embodiments, however, the metal materials or salts are deposited during the in situ growth process of the carbon nanotubes. In still other embodiments, metal materials or metal salts are incorporated with the carbon nanotubes after the nanotube growth process, but prior to depositing the nanotubes on a surface.

In some embodiments of the present invention, the CNTs are first grown on a substrate, with subsequent incorporation of metal material and/or metal salts to alter the work function. Some exemplary components of these embodiments are described below.

Substrate Preparation

In some embodiments, the substrate can be considered as a material on which the nanotubes are deposited, and having three constituent parts (layers): substrate base, catalyst, and interface layer in between them.

For many applications, the substrate base is a dielectric material withstanding the temperatures on order of 700° C. (e.g., Corning 1737F glass, B3-94 Forsterite ceramic material). It has been determined that carbon forms on Forsterite substrates over a broader range of deposition conditions than it does on the glass.

In this particular example, a catalyst is consumed during the deposition of the nanotubes (the feature of the CNT formation when carbon grows only on the catalyst interface thus lifting the Ni particle and giving rise to CNTs). The roles of the interface layer are (1) to provide feedlines to the emitter and (2) to be a bonding layer between the glass and the catalyst or nanotubes. Ti—W (10%–90%) successfully fulfills the two functions. In some embodiments, the thickness of the Ti—W coating may be 2000 Å.

The catalyst materials used were Ni and Fe. In typical deposition conditions for Ni, no carbon is formed on the iron catalyst. Ni was likely to have a lower temperature of cracking C—H bonds, though not many experiments have been done with Fe.

The thickness of the Ni catalyst layer is important. If the thickness is too small (<~70 Å), the crystalline structure of the formed carbon is rather amorphous. So also with a thick Ni coating, 200 Å or more. The advantageous thickness value lies in the range of about 130–170 Å.

Deposition Conditions

Carbon was deposited in a gaseous mixture of ethylene, $C_2H_4$, and hydrogen, with the use of a catalyst. The flow rates of the gases are of the order of a standard liter per minute, and have comparable values. Typical flow rates for $H_2$ are 600 to 1000 sccm (standard cubic centimeters per minute), and 700 to 900 sccm for ethylene. The currently used ratio of the gas flows is $H_2:C_2H_4$=600:800 sccm. The gases used for carbon deposition were $H_2$, $C_2H_4$, $NH_3$, $N_2$, He. Ethylene is a carbon precursor. The other gases can be used to dilute ethylene to get carbon growth. The temperature was set to 660–690° C. Suitable heating devices include tube furnaces such as a 6-inch Mini Brute quartz tube furnace.

Figure 6:
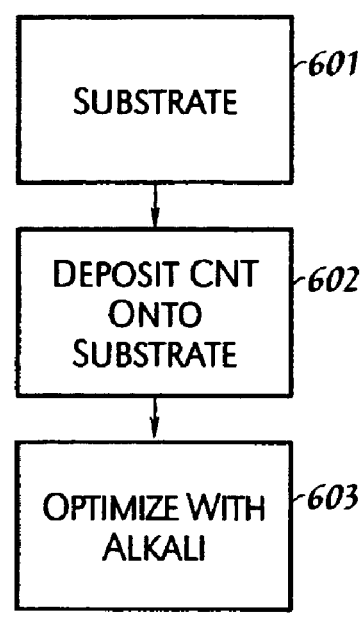
FIG. 6 illustrates a method of making in accordance with an embodiment of the present invention.

The deposition Procedure and Timing (steps 601–602 in FIG. 6)

1. Loading the sample and air evacuation. This step takes about 3 to 5 minutes, until the pressure reaches its base value of about 15–20 mTorr.
2. Back fill. This step replaces a He purge stage used to be a first deposition step in small furnace. The gas used for back filling is $H_2$. In a large furnace, it takes 10 minutes to get atmospheric pressure within the tube. The temperature in the tube decreases since the hydrogen effectively transfers heat to the distant parts of the tube that have lower temperature.
3. Push to deposition zone.
4. Preheat. It takes about 15 minutes for the substrate to reach equilibrium temperature inside the tube.
5. Deposition. While the hydrogen is on, ethylene is turned on for another 15 minutes to obtain carbon growth.
6. Purge. In fact, purging can be considered a part of the deposition due to slow gas flows along the tube. This step requires the ethylene to be turned off, and lasts 5 minutes with $H_2$ on.
7. Pull to load zone—Evacuate—Vent—Unload.

Preparing the Metal Activation

Figure 3:
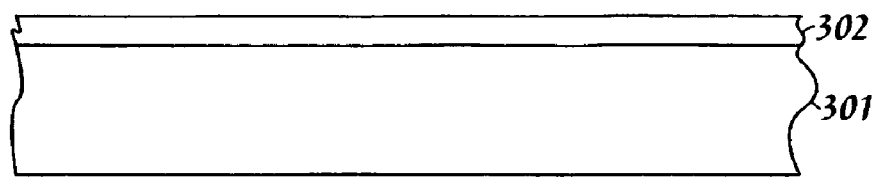
FIG. 3 illustrates an apparatus configured in accordance with an embodiment of the present invention.

Once the carbon (CNT) film is prepared (steps 601–602 in FIG. 6), the sample can be activated by coating it with a layer of alkali metal (step 603). These metals include lithium (Li), sodium (Na), potassium (K), rubidium (Rb), cesium (Cs), and francium (Fr). Cs lowers the work function more than the other alkali metals. This result is an optimized carbon film with alkali material 302 on a substrate 301 (FIG. 3).

Variations on the Above Embodiments

In some embodiments, the carbon film is placed in a vacuum chamber and a source of Cs is placed with the carbon film such that Cs atoms can be deposited onto the carbon film by evaporation, sputtering, or other physical vapor deposition methods. The thickness of the Cs film is optimized such that the work function of the carbon film is at its lowest.

Another means of coating the carbon film with an metal or alkali metal can be done by depositing a compound of the metal or alkali metal, such as a salt (e.g., CsCl), oxide, nitride or similar compound, onto the carbon film by physical vapor deposition methods (e.g., evaporation), or by painting, spraying or soaking in a wet solution. This compound can then be optionally decomposed (e.g., reduced to a metal with a reducing agent) in a plasma or by heat to leave only the Cs metal on the carbon film. The amount of Cs can be controlled by metering the amount of the compound placed on the carbon film or by controlling the means of decomposition.

Another means of activating the carbon film is to put the substrate with the carbon film together with a source of alkali metal in a sealed furnace having a vacuum or inert gas atmosphere (e.g. helium, nitrogen, etc.). The sample and source of Cs is heated to high temperatures under high pressures such that the alkali metal atoms intercalate into the carbon film. Intercalation means that the Cs atoms diffuse into the carbon film but do not replace the carbon atoms in the film, and instead fit into positions between layers of the carbon film. The optimization can be controlled by controlling the alkali metal intercalation parameters.

Another means of activating the carbon film is to dope the carbon film with alkali metal atoms. This means that some of the carbon atoms in the CNT matrix are replaced with atoms of alkali metal. This can be done during the growth of the carbon film or after the film is grown.

In some embodiments wherein metal salts are incorporated with CNT material, the step of decomposition or reduction of these metal salts to a metal is unnecessary. In other embodiments, metal incorporated with CNTs is actually converted to a salt material (this can occur spontaneously, for example, when an alkali metal is exposed to air). In some embodiments it is desirous to have metal salts incorporated with the CNTs. In some embodiments, micro- or nano-porous crystals of metal salts incorporated into a CNT material (e.g., adsorbed onto the CNT surface(s)), because of their polar nature, can be oriented in an electric field.

Optimization of Metal Deposition

The optimization of the alkali metal deposition can be performed in at least a couple of different ways.

Several samples can be made and tested for optimal performance. Each sample can have a measured amount of material that is different from the other samples. By correlating the results to the amount of coating or activation, the optimal amount can be defined for the type of sample investigated.

Another method is similar to above, except the emission measuring tools are in the same vacuum chamber as the alkali source. In this way, the sample can be measured for emission at the same time the alkali metal is coating the sample. This has the advantage in that the feedback is in real time and exposure to air does not complicate the results. Once the results are known, then the same amount of material can be applied to other samples without having to monitor the results. The results are expected to be reproducible such that they do not have to be monitored for every sample.

Thereafter, the carbon film with alkali material (302) can be used on a cathode for many applications where emitted electrons are useful, including x-ray equipment and display devices, such as in U.S. Pat. No. 5,548,185, which is hereby incorporated by reference.

Figure 4:
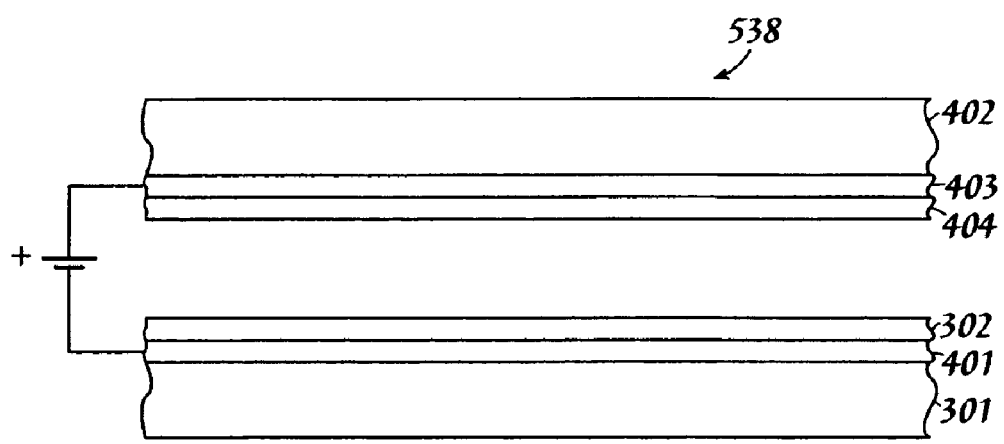
FIG. 4 illustrates a display.

FIG. 4 illustrates a portion of a field emission display 538 made using a cathode, such as created above and illustrated in FIG. 3. Included with the cathode is a conductive layer 401. The anode may be comprised of a glass substrate 402, and indium tin layer 403, and a phosphor layer 404. An electrical field is set up between the anode and the cathode. Such a display 538 could be utilized within a data processing system 513, such as illustrated with respect to FIG. 5.

A representative hardware environment for practicing the present invention is depicted in FIG. 5, which illustrates an exemplary hardware configuration of data processing system 513 in accordance with the subject invention having central processing unit (CPU) 510, such as a conventional microprocessor, and a number of other units interconnected via system bus 512. Data processing system 513 includes random access memory (RAM) 514, read only memory (ROM) 516, and input/output (I/O) adapter 518 for connecting peripheral devices such as disk units 520 and tape drives 540 to bus 512, user interface adapter 522 for connecting keyboard 524, mouse 526, and/or other user interface devices such as a touch screen device (not shown) to bus 512, communication adapter 534 for connecting data processing system 513 to a data processing network, and display adapter 536 for connecting bus 512 to display device 538. CPU 510 may include other circuitry not shown herein, which will include circuitry commonly found within a microprocessor, e.g., execution unit, bus interface unit, arithmetic logic unit, etc. CPU 510 may also reside on a single integrated circuit.

Metal Salt Treatment of Carbon Nanotubes

Further to the present invention, Applicants have found that treatment of carbon nanotubes with metal salt solutions can significantly improve the field emission properties of such materials. Such treatment generally involves immersion of a CNTs in a metal salt solution and subsequent removal of CNTs from the metal salt solution, and optionally washing and/or drying the CNTs.

CNTs and metal salts can be any of those described above. CNTs, especially SWNTs, may be ground into powder form prior to immersion in the metal salt solution using, for example, a simple ball mill like that shown in FIG. 7. Such grinding may serve to facilitate dispersion of the CNTs in the metal salt solution and further dispersal aids, such as surfactants, may also be used.

While not intending to be bound by theory, it is believed that the field emission improvement described above is a result of adsorption of metal ions on the surface of the CNTs which in turn can lower the work function of the CNTs, which if left untreated is about 5.5 eV. Alkali metals for which this works include Li(2.93 eV), Na(2.36 eV), K(2.29 eV), Rb(2.261 eV), Cs(1.95 eV) (Handbook of Chemistry and Physics, p12–124, 78$^{th}$ Edition 1997–1998, CRC Press). Besides these alkali elements, some other materials whose work function is generally less than about 4 eV, typically less than about 3.5 eV, and more typically less than about 3 eV, may also be considered effective at improving the field emission properties of the carbon nanotubes. Examples of such metals include, but are not limited to, Ba(2.52 eV), Ca(2.87 eV), Ce(2.9 eV), Gd(2.9 eV), Sm(2.7 ev), Sr(2.58 eV).

This process has several advantages in that 1) large quantities of CNTs can be easily and efficiently surface-treated with metal ions in this manner at relatively low cost; 2) metal ions do not have to be decomposed (e.g., reduced) to their corresponding pure metal; and uniform deposition over large area substrates is possible using currently available low-cost equipment. Such deposition methods include, but are not limited to, spraying a dispersion of such treated CNTs onto a substrate surface.

Variations on the abovementioned embodiments include an optional reduction of the metal salt to a metal. While not intending to be bound by theory, when metal salt treated CNTs are used as the cathode material in field emission devices (see FIG. 4), it is possible that some or all of the metal cations adsorbed onto the CNT surface become reduced when a potential is applied between the cathode and the anode and an emission current begins to flow between them. Further, in some embodiments, micro- or nano-crystals of such metal salts which coat CNTs used in such emission devices, may become oriented when an electric field is generated as such.

The following example is provided to more fully illustrate some of the embodiments of the present invention. The example illustrates methods by which metal salt-treated CNTs can be made and prepared for field emission applications. It should be appreciated by those of skill in the art that the techniques disclosed in the examples which follow represent techniques discovered by the inventor to function well in the practice of the invention, and thus can be considered to constitute exemplary modes for its practice. However, those of skill in the art should, in light of the present disclosure, appreciate that many changes can be made in the specific embodiments which are disclosed and still obtain a like or similar result without departing from the spirit and scope of the invention.

EXAMPLE

This Example describes a method used to make Cs salt treated-CNTs and their preparation for field emission applications.

1. Treating Carbon Nanotubes with Cs Salts

This process provides a way of contacting Cs ions to the surface of carbon nanotube powders using an Alkali salt/water solution.

A) Source of carbon nanotube and Cs salt

Purified single wall carbon nanotubes (SWNTs) were purchased from Carbon Nanotechnologies, Inc., Houston, Tex., USA. These SWNTs were about 1–2 nm in diameter and about 5–20 μm in length. It is believed that other kinds of carbon nanotubes such as single wall, double-wall or multiwall carbon nanotubes (MWNTs) with different diameters and lengths from other venders could be substituted in this example with similar results.

Cesium nitrate ($CsNO_3$) was obtained from Spectrum Laboratory Products, Inc. Gardena, Calif., USA. Applicants suggest that other kinds of Cs salt such as $CsCl$, $Cs_2CO_3$, and $Cs_2SO_4$ could be substituted for $CsNO_3$ in this example with similar results.

B) Grinding the SWNTs

Figure 7:
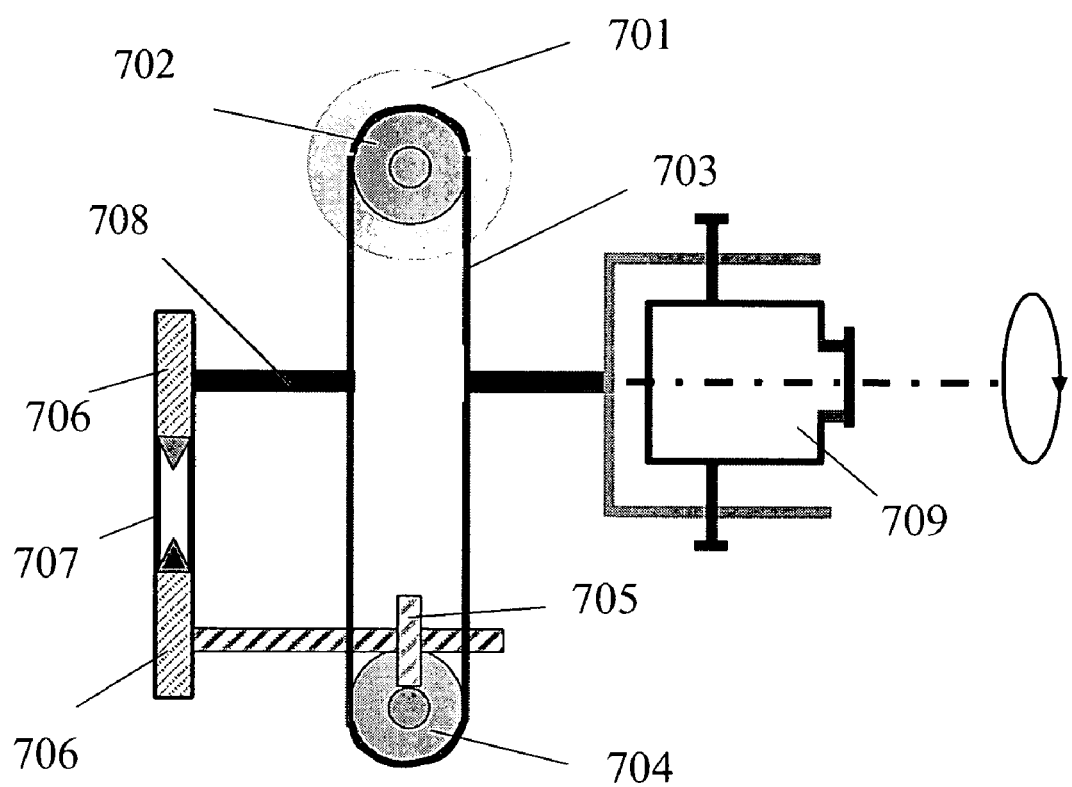
FIG. 7 illustrates a ball milling device used to grind carbon nanotubes.

CNTs can easily agglomerate and form clusters and bundles—held together by van der Waals attractive forces. Thus, it is often beneficial to disperse them before they are immersed in the Cs salt/water solution. A simple ball mill was used to grind SWNT bundles. FIG. 7 is a diagram of this ball mill comprising a motor 701 to which a wheel 702 is attached to a belt 703 which drives a second wheel 704. This second wheel 704, via a turbine 705, gear 706, and chain 707 assembly, drives a shaft 708 which spins a milling chamber 709. It is in this milling chamber 709 that the CNTs and/or particles are placed. The rate at which this machine is typically run is about 50–60 revolutions per minute.

In this particular example, approximately 0.5 g of SWNTs, together with tens of $Al_2O_3$ balls used for grinding (~5–10 mm in diameter), were mixed with about 100 ml water. The CNT powders were ground for between 1–14 days in order to fully disperse the carbon nanotubes. Optionally, a surfactant such as sodium dodecylbenzene sulfonate (M. F. Islam, E. Rojas, D. M. Bergey, A. T. Johnson, and A. G. Yodh, Nano Lett.3(2), 269–273(2003), incorporated herein by reference), or similar materials, can also be added to the mixture in order to achieve better dispersion of the carbon nanotubes.

C) Preparation of the Cs salt solution

In this example, approximately 2 g of $CsNO_3$ powder was put into a beaker with approximately 400 ml of water and was stirred using a glass stirbar until the powder was dissolved. The solution can be optionally filtered one or more times to extract impurities and/or difficult to dissolve particles.

D) Immersing the ground CNT dispersion into the Cs salt solution

Figure 8:
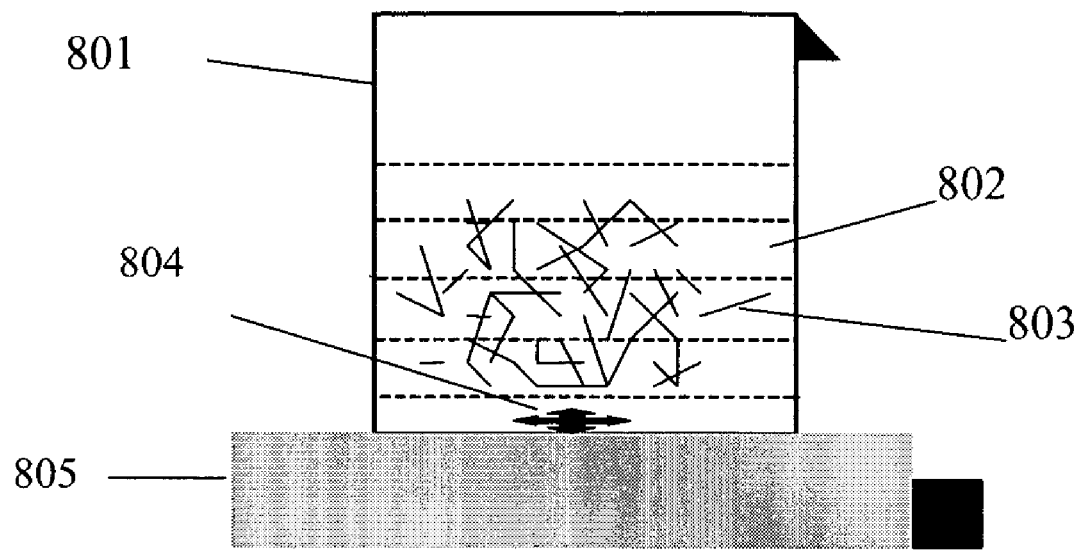
FIG. 8 illustrates how metal ions (e.g., $Cs^+$) are adsorbed onto the surface of carbon nanotubes.

The ground Carbon nanotubes, dispersed in approximately 100 ml of water, was added to the $CsNO_3$ solution to form a mixture. The total solution volume was 500 ml and the concentration of $CsNO_3$ was 0.02 M (other concentrations may be more optimal for achieving the best field emission properties from CNTs). Then, the solution was placed onto a hot plate/magnetic stirrer and stirred using a magnetic stir bar for approximately 15–20 hours (the time can be varied in other embodiments such that the CNTs surface becomes saturated with metal ions. FIG. 8 illustrates how Cs ions are allowed to adsorb onto the surface of CNTs. Referring to FIG. 8, beaker 801 contains $CsNO_3$/water solution 802, CNTs 803, and a magnetic stir bar 804. The mixture is heated/stirred by a stirring hot plate 805.

E) Washing the CNTs

After the mixture was stirred for approximately 15–20 hours, the CNTs were washed several times using deionized water in order to remove the salt residue in the solution. The water was removed until all the CNTs sank down to the bottom of the beaker. Then, new water was added. After the CNTs were washed, they could be dried in a oven at approximately 40–100° C. for a certain time. In this experiment, the CNT solution was further washed several times with isopropyl alcohol (IPA) in order to then prepare a CNT cathode.

2. Applying Cs Salt-Treated Carbon Nanotubes to the Surface of a Substrate

Figure 9:
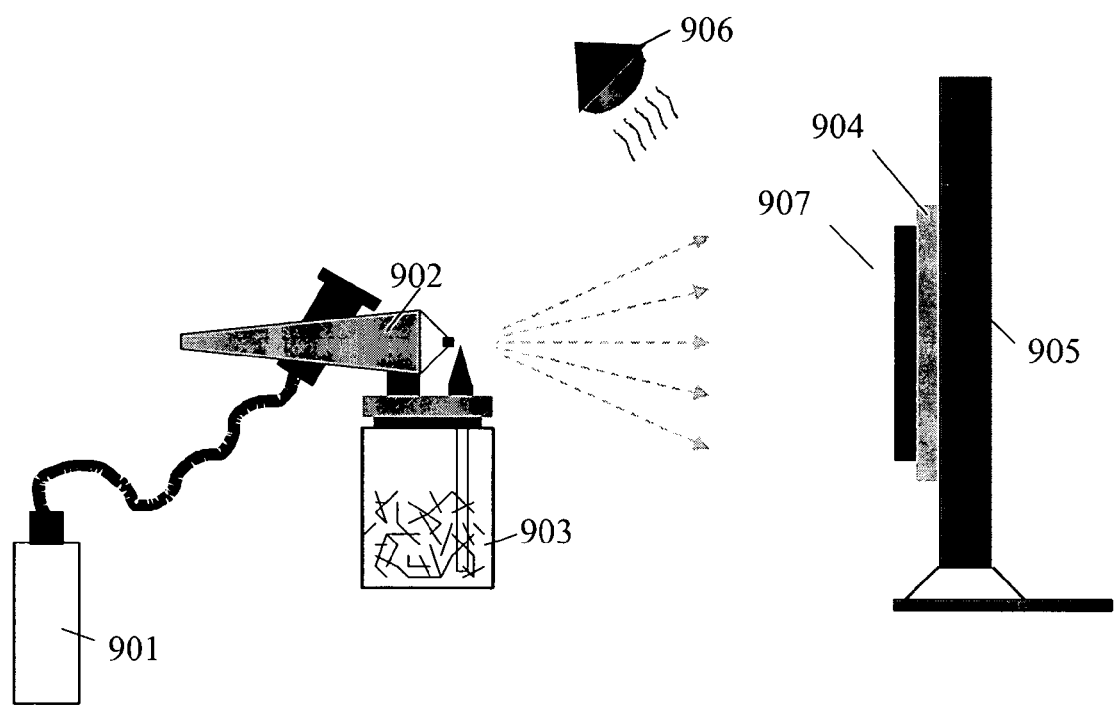
FIG. 9 illustrates a spraying technique used to deposit metal salt-treated carbon nanotubes onto a surface.

In this Example, a spraying technique was employed to deposit Cs salt-treated CNTs onto a substrate. Because CNTs can easily clump together if they are, an ultrasonic horn or bath was used to redisperse them in an IPA solution just prior to spraying them onto the substrate. In this Example, the CNT-IPA solution was sprayed onto a conventional silicon (Si) substrate comprising an area of approximately $2 \times 2$ cm$^2$ (such a solution could also be sprayed onto various other substrates such as metal, ceramic, glass, semiconductors and plastics). In order to get better coating uniformity and dispersal on the substrates, more IPA can be added into the above solution prior to spraying. In this Example, the solution used for spraying was a mixture of approximately 0.2 g of Cs salt-treated CNTs in approximately 100 ml of IPA. In alternative embodiments, this solution can be applied to a selective area or areas using a shadow mask. In order to prevent the IPA from flowing to unexpected area, the substrate was heated to approximately 70° C. on both the front side and back side during the spraying process, in order to evaporate the IPA quickly. The substrate was sprayed back and forth and/or up and down several to tens of times until the entire surface was coated with the mixture. The thickness of the mixture was about 1–10 μm. The surface was then dried in air. FIG. 9 illustrates the spraying technique employed in this Example, wherein a condensed gas 901 is used to charge an atomizer 902 containing a solvent-suspended mixture of metal salt-treated carbon nanotubes 903. Mixture 903 is sprayed onto a substrate 904, optionally in contact with heater 905 and/or infrared (IR) heat lamp 906, to form cathode material layer 907 comprising metal salt-treated CNTs.

Techniques other than spraying may also be used to apply the mixture to a surface. Such techniques include, but are not limited to, electrophoretic deposition, dipping, screen-printing, ink-jet printing, dispensing, brushing, and combinations thereof. Other solvents, such as acetone or methanol, may also be used as the carrier (in lieu of IPA) when applying the Cs salt-treated CNTs to a surface.

Figure 10:
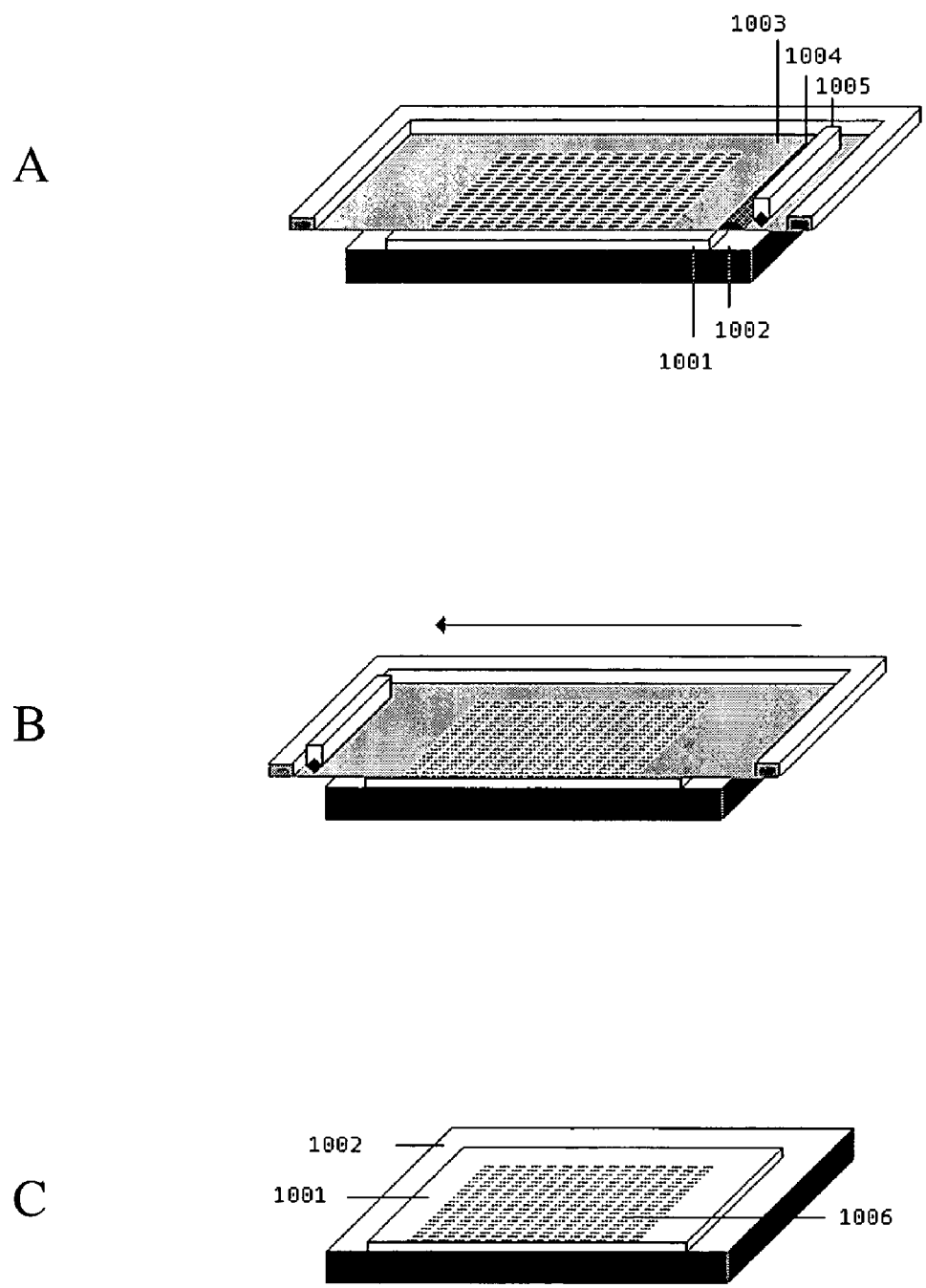
FIG. 10 illustrates a screen printing device, which can be used in the depositing of a metal salt-treated carbon nanotube dispersion onto a substrate.

FIGS. 10A–C illustrate a screen printing method by which a dispersion of metal salt-treated carbon nanotubes can be deposited onto a substrate according to some embodiments of the present invention. Referring to FIG. 10A, a substrate 1001 is placed on a substrate stage/chuck 1002 and brought in contact with an image screen stencil 1003. A dispersion 1004 comprising metal salt-treated carbon nanotubes (dispersion 1004 may also comprise insulating or conducting particles such as alumina, silica, or silver, and also standard paste vehicles and thinners to control the viscosity and curing properties of the paste) is then "wiped" across the image screen stencil 1003 with a squeegee 1005, as shown in FIG. 10B. The dispersion 1004 then contacts the substrate 1001 only in the regions directly beneath the openings in the image screen stencil 1003. The substrate stage/chuck 1002 is then lowered to reveal the patterned cathode material 1006 on substrate 1001, as shown in FIG. 10C. The patterned substrate is then removed from the substrate stage/chuck.

Figure 11:
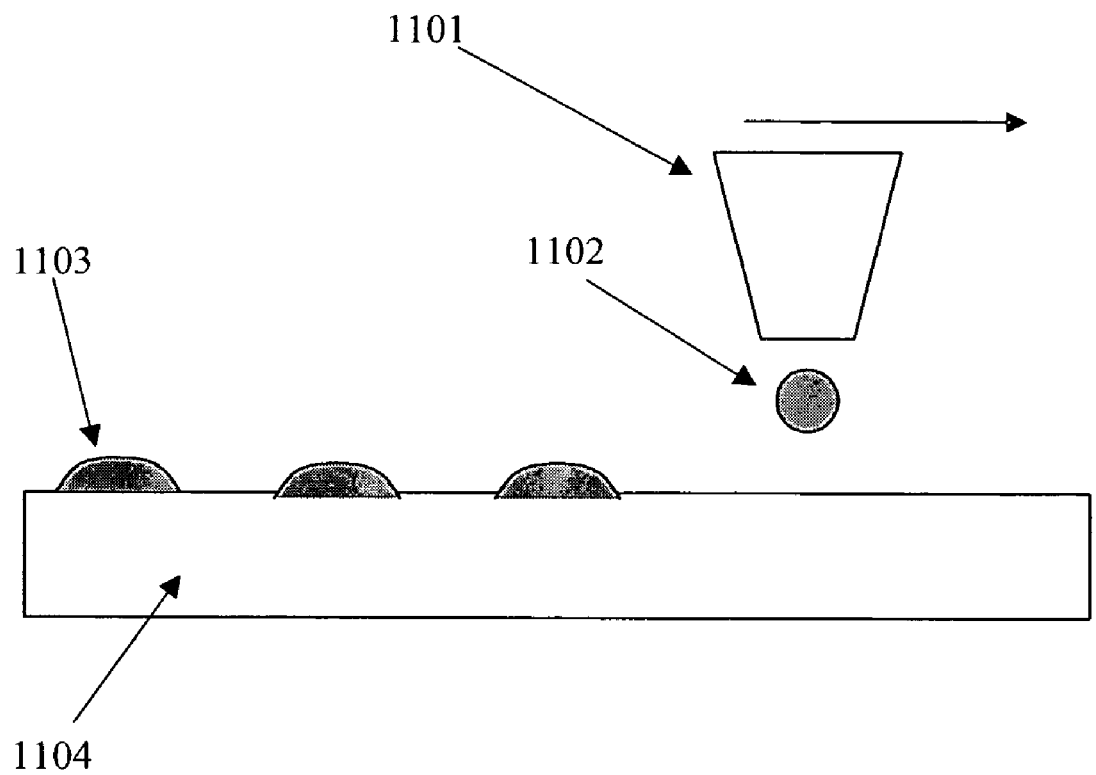
FIG. 11 illustrates how dispensing or ink jet printing can be used to deposit a dispersion of metal salt-treated carbon nanotubes on a substrate.

FIG. 11 illustrates an embodiment wherein a dispensor or an ink jet printer is used to deposit metal salt-treated carbon nanotubes onto a substrate. Referring to FIG. 11, printing head 1101 is translated over a substrate 1104 in a desired manner. As it is translated over the substrate 1104, the printing head 1101 sprays droplets 1102 comprising metal salt-treated carbon nanotubes dispersed in a solvent. As these droplets 1102 contact substrate 1104, they form printed cathode material 1103 comprising metal salt-treated carbon nanotubes. In some embodiments, the substrate 1104 is heated so as to effect rapid evaporation of solvent within said droplets. Heat and/or ultrasonic energy may be applied to the printing head 1101 during dispensing.

3. Activation of the CNTs

Once the Cs salt-treated CNTs were deposited onto the surface of the substrate, an activating technique, referred to herein as "tape activation," can be applied to the CNT film by applying an adhesive tape material to the film and then pealing the adhesive tape away (Yang Chang, Jyh-Rong Sheu, Cheng-Chung Lee, Industrial Technology Research Institute, Hsinchu, TW, "Method of Improving Field Emission Efficiency for Fabrication Carbon Nanotube Field Emitters", U.S. Pat. No. 6,436,221 B1, incorporated herein by reference).

After the carbon nanotubes were sprayed on to the substrate, an adhesive tape process may be needed to remove the top layer of material from the surface. In this Example, clear tape (3M, Catalog number #336) was optionally used to remove the top layer of material. The tape was applied to the Cs salt-treated CNT layer using a laminating process. Care was taken to ensure that there was no air between the tape and the CNT layer (if a bubble is exists, the mixture at that area will not be removed or treated as the other areas are). A rubber roll was used to further press the tape in order to further eliminate air at the intersection of the tape and the Cs salt treated CNT layer. Finally, the tape is removed.

4. Field Emission Test of the Cs Salt-Treated CNTs in a Field Emission Device

To compare field emission properties, untreated CNTs were also made using the same spray and activation conditions as the Cs salt treated sample. Both samples were then tested by mounting them with a phosphor screen in a diode configuration, like that shown in FIG. 4, with a gap of about 0.63 mm between the anode and the cathode. The test assembly was placed in a vacuum chamber and pumped to about $10^{-7}$ Torr. The electrical properties of the cathode were then measured by applying a negative, pulsed voltage (AC) to the cathode and holding the anode at ground potential and measuring the current at the anode (a DC potential could also be used for the testing, but this may damage the phosphor screen). A graph of the emission current vs. electric field for the two samples is shown in FIG. 12.

Figure 12:
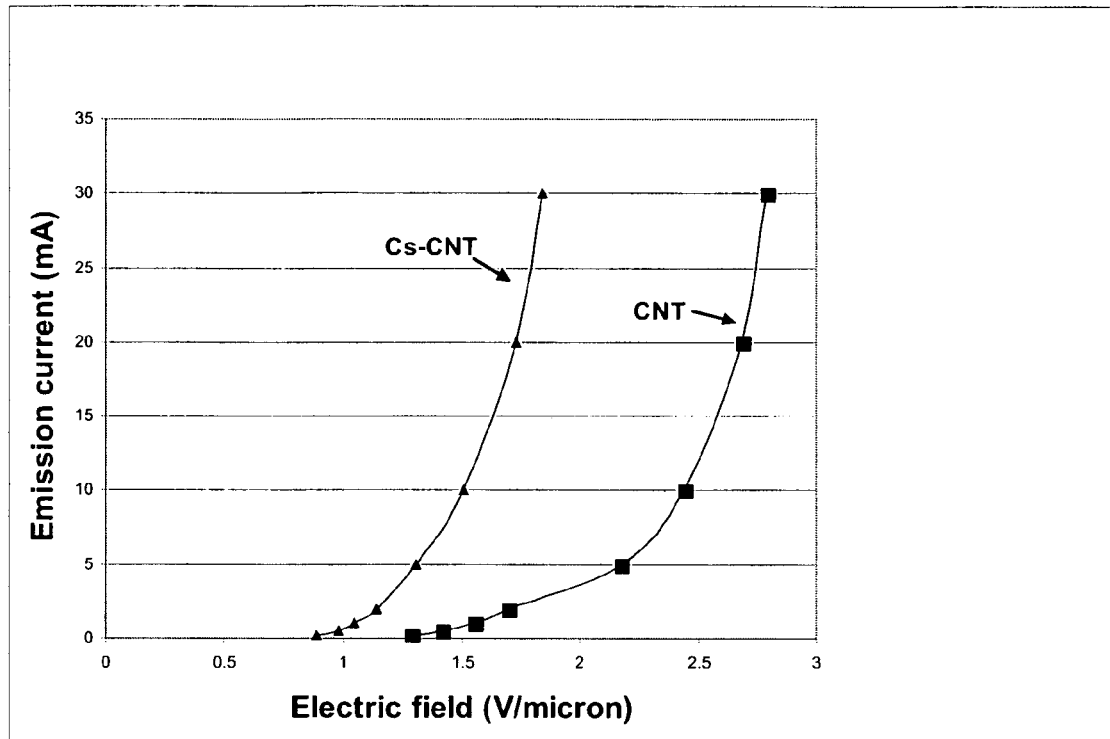
FIG. 12 depicts a graph of the emission current vs. electric field for untreated carbon nanotubes (CNT) and Cs salt-treated carbon nanotubes (Cs—CNT).

It can be seen from FIG. 12 that the Cs salt-treated CNTs have significantly better field emission properties than untreated CNTs. A threshold field of less than 0.9 V/μm and emission current of 30 mA at 1.84 V/μm was achieved for the Cs salt-treated CNTs, whereas the untreated CNTs exhibited a threshold field of about 1.3 V/μm and required a field of approximately 2.80 V/μm to generate an emission current of 30 mA.

Although the present invention and its advantages have been described in detail, it should be understood that various changes, substitutions and alterations can be made herein without departing from the spirit and scope of the invention as defined by the appended claims.

What is claimed is:

1. A field emission apparatus comprising:
   a) a low pressure gaseous environment; and
   b) a cathode comprising:
      i. a substrate; and
      ii. a metal salt-treated carbon nanotube layer deposited on the substrate.

2. The field emission apparatus of claim 1, wherein the metal salt is selected from the group consisting of alkali metal salts, alkaline earth metal salts, transition metal salts, p-block metal salts, rare earth metal salts, and combinations thereof.

3. The field emission apparatus of claim 1, wherein the metal salt is a cesium salt.

4. The method of claim 1, wherein the metal salt-treated carbon nanotube layer comprises a thickness which ranges from about 1 μm to about 10 βm.

5. A field emission apparatus comprising:
   a) a low pressure gaseous environment; and
   b) a cathode comprising:
      i. a substrate; and
      ii. a metal salt-treated carbon nanotube layer deposited on the substrate, wherein the metal salt-treated carbon nanotube layer comprises single-wall carbon nanotubes.

6. The field emission apparatus of claim 5, wherein the metal salt is selected from the group consisting of alkali metal salts, alkaline earth metal salts, transition metal salts, p-block metal salts, rare earth metal salts, and combinations thereof.

7. The field emission apparatus of claim 5, wherein the metal salt is a cesium salt.

8. The method of claim 5, wherein the metal salt-treated carbon nanotube layer comprises a thickness which ranges from about 1 μm to about 10 μm.

* * * * *

UNITED STATES PATENT AND TRADEMARK OFFICE
CERTIFICATE OF CORRECTION

| | |
|---|---|
| PATENT NO. | : 7,057,203 B2 |
| APPLICATION NO. | : 10/715934 |
| DATED | : June 6, 2006 |
| INVENTOR(S) | : Dongsheng Mao et al. |

It is certified that error appears in the above-identified patent and that said Letters Patent is hereby corrected as shown below:

Claim 4, column 12, line 5, please replace "βm" with --μm--.

Signed and Sealed this

Fifth Day of September, 2006

JON W. DUDAS
*Director of the United States Patent and Trademark Office*